(12) United States Patent
Raulea

(10) Patent No.: US 7,326,505 B2
(45) Date of Patent: Feb. 5, 2008

(54) LITHOGRAPHIC APPARATUS AND DEVICE MANUFACTURING METHOD

(75) Inventor: Liviu Valer Raulea, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 597 days.

(21) Appl. No.: 10/853,722

(22) Filed: May 26, 2004

(65) Prior Publication Data

US 2005/0266323 A1 Dec. 1, 2005

(51) Int. Cl.
*G03C 5/00* (2006.01)
(52) U.S. Cl. .................... 430/30; 430/311; 430/331
(58) Field of Classification Search .............. 430/30, 430/311, 331
See application file for complete search history.

(56) References Cited

U.S. PATENT DOCUMENTS 6,628,371 B1 * 9/2003 Ishikawa .................... 355/69
6,790,681 B2 * 9/2004 Matsunaga et al. ............ 438/5

* cited by examiner

*Primary Examiner*—Christopher G. Young
(74) *Attorney, Agent, or Firm*—Pillsbury Winthrop Shaw Pittman LLP

(57) ABSTRACT

A device manufacturing method for a substrate of a batch of substrates includes conveying the substrate to an exposing position of a lithographic apparatus, exposing the substrate at the exposing position to a beam of radiation of the lithographic apparatus, and conveying the exposed substrate from the exposing position toward a processing position configured to process the exposed substrate, wherein a start time for the exposing of the substrate is varied so as to control that a time interval between the end of the exposing of the substrate at the exposing position and the start of processing of the substrate at the processing position for the substrate is substantially the same as for each other substrate in the batch of substrates.

20 Claims, 4 Drawing Sheets

LITHOGRAPHIC APPARATUS AND DEVICE MANUFACTURING METHOD

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

A lithographic system is arranged for performing an exposure process for exposing a substrate and for subsequently performing a processing process including baking and developing of the exposed substrate. Generally, the lithographic system comprises a lithographic apparatus for performing the exposure process and a track system or a track unit for performing the processing process. The formation of the substrate generally comprises applying a plurality of stacked layers on the substrate, wherein for each layer an exposure process and a processing process is applied. For the manufacturing of each layer the substrate is conveyed between the lithographic apparatus and the track system.

According to a conventional method for exposing and processing a batch of substrates, the lithographic system starts exposing a substrate immediately after the substrate is received at the exposing position.

SUMMARY

Sometimes, exposing a batch of substrates according to conventional methods may yield a high variability in the quality between the substrates in the batch, wherein the structures of the substrates differ from substrate to substrate. The latter can mean that some substrates meet certain requirements relating to critical dimension (CD) and/or critical dimension uniformity (CDU) and that others fail to meet these requirements.

Substrates in a batch are typically conveyed between an exposing position in a lithographic apparatus of a lithographic system and a processing position in a track of the lithographic system. The conveying of substrates between the exposing and processing positions may yield intense traffic with high risks of traffic jams. The possibility of a traffic jam is even higher when a dual stage lithographic apparatus is employed. With a dual stage lithographic apparatus, the width of the lithographic apparatus should be limited and so the loading and unloading of substrates is typically done via one side of the lithographic apparatus. Consequently, the loading and unloading of substrates to a substrate stage in the lithographic apparatus typically cross each other. So, although a substrate handler of the dual stage lithographic apparatus may provide a separate input and output path, the input path (loading of fresh substrates to a stage) inevitably crosses the output path (unloading of exposed substrates from a stage). Thus, sometimes complex conveyance of substrates in a lithographic system can be a cause for a relative high variability in the conveying time of substrate as measured between the end of the exposure process for the substrate and the start of a processing step for the substrate. This conveying time is also called a post-exposure delay. During the post-exposure delay, the dimensions of an exposed structure on the substrate typically increases due to diffusion of exposed radicals into unexposed areas.

Accordingly, it would be advantageous, for example, to provide a device manufacturing method and a lithographic system wherein exposed substrates are of substantially equal quality.

According to an aspect of the invention, there is provided a device manufacturing method for a substrate of a batch of substrates, wherein the method comprises:

conveying the substrate to an exposing position of a lithographic apparatus;

exposing the substrate at the exposing position to a beam of radiation of the lithographic apparatus; and conveying the exposed substrate from the exposing position toward a processing position configured to process the exposed substrate, wherein a start time for the exposing of the substrate is varied so as to control that a time interval between the end of the exposing of the substrate at the exposing position and the start of processing of the substrate at the processing position for the substrate is substantially the same as for each other substrate in the batch of substrates.

In an embodiment, the controlling of the timing may be based on information relating to the status of the conveying of the substrate to and/or from the exposing position.

In an embodiment, the controlling of the timing comprises introducing a time delay before the exposing of the substrate. The time delay may facilitate achieving a substantially constant post-exposure delay. With a substantially constant post-exposure delay, the increase of the dimensions and thus the final structures of the substrates may be substantially equal for each substrate in the batch such that variation of quality between the substrates may be reduced. A related advantage is that the quality of substrates between batches is also more reproducible.

In an embodiment, conveying the substrate to the exposing position comprises conveying the substrate into a buffer located just before the exposing position and conveying the substrate from the buffer toward the exposing position. In an embodiment, conveying the exposed substrate from the exposing position comprises conveying the exposed substrate into the buffer and conveying the exposed substrate from the buffer toward the processing position. The buffer can comprise two separate sub-buffers, a first sub-buffer applicable to conveying the substrate to the exposing position and a second sub-buffer applicable to conveying the exposed substrate from the exposing position. The buffer may alleviate problems which otherwise could result from the crossing of substrate input and output paths and expedite conveying of the substrate. Note that in a similar way a buffer can be provided just before the processing position of a track system.

In an embodiment, controlling of the timing comprises initiating the exposing of the substrate if at least one of the following conditions is complied with: an input path condition wherein conveying a subsequent substrate to the exposing position can be completed substantially by or at the moment that exposure of a current substrate is completed; and an output path condition wherein conveying a current substrate from the exposing position can be performed in a pre-determined time interval starting after exposure of a current substrate is completed. Thus, conveying a current substrate from the exposing position is initiated if that substrate can be transported to the processing position in a pre-determined time-interval, for example, without any disturbances which would cause a varying time delay in the output path. In other words, the exposing step is initiated if it is forecast that the output path will be free for transportation of the exposed substrate at the end of the exposure process. Similarly, the same considerations—the path for transportation is free—apply to the input path condition.

In an embodiment, where the lithographic apparatus is of a dual stage type, a robot is often provided to perform conveying a subsequent substrate from a buffer to the exposing position and conveying a current exposed substrate from the exposing position to the buffer. In this case, the buffer can be located on a first stage of the dual stage lithographic apparatus and the exposing position can be located on a second stage of the dual stage lithographic apparatus, wherein the stages can be interchanged by a stage swap. The exposed substrate may be obtained by a robot from the relevant stage with the buffer for further transportation to the processing position.

Typically specific timing should be realized via the output path condition to see that the input path does not hinder the output path. In an embodiment, controlling of the timing comprises initiating the exposing of the substrate if at least one of the following conditions is complied with: an input path condition wherein conveying a subsequent substrate to a buffer can be completed substantially by or at the moment that exposure of a current substrate is completed; and an output path condition wherein conveying a current substrate from the exposing position can be performed in a pre-determined time interval starting after exposure of a current substrate is completed. So, for example, a stage swap is not performed too late causing a substrate which is coming a fraction of time "too late" along the input path will be missed causing a delay and block in the input path which can potentially hinder the output path. Thus, a relatively high throughput of substrates through the lithographic system may be achieved.

According to an embodiment, exposing of the substrate is initiated if both the input path and the output path conditions are complied with.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to any device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein a surface of the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

The methods described herein may be implemented as software, hardware or a combination. In an embodiment, there is provided a computer program comprising program code that, when executed on a computer system, instructs the computer system to perform any or all of the methods described herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
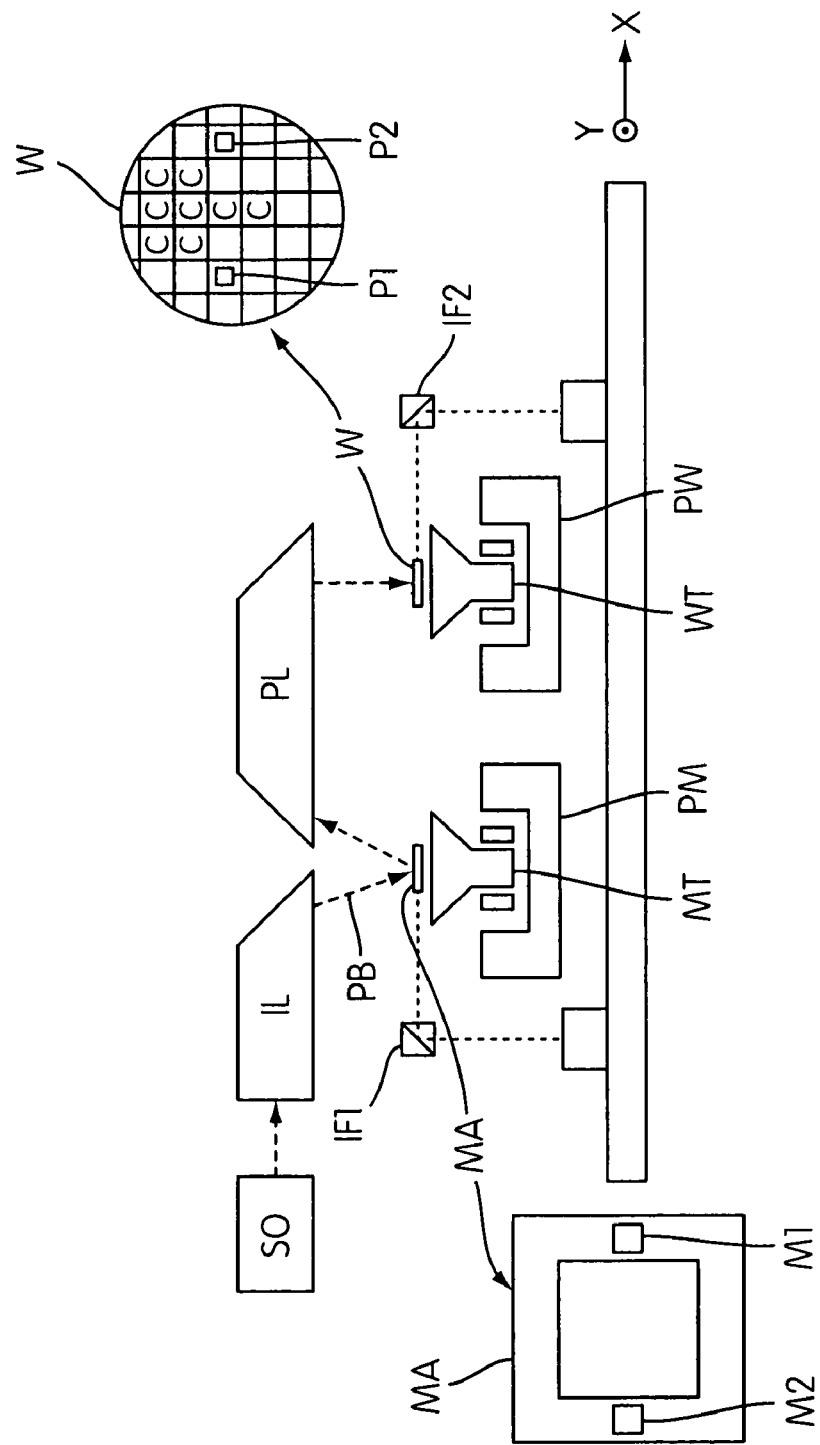
FIG. 1 depicts a lithographic apparatus according to an embodiment of the invention.

FIG. 1 schematically depicts a lithographic apparatus according to a particular embodiment of the invention. The apparatus comprises:

an illumination system (illuminator) IL for conditioning a projection beam PB of radiation (e.g. UV or EUV radiation).

a first support structure (e.g. a mask table) MT for holding a patterning device (e.g. a mask) MA and connected to a first positioning device PM for accurately positioning the patterning device with respect to item PL;

a substrate table (e.g. a wafer table) WT for holding a substrate (e.g. a resist-coated wafer) W and connected to a second positioning device PW for accurately positioning the substrate with respect to item PL; and a projection system (e.g. a reflective projection lens) PL for imaging a pattern imparted to the projection beam PB by the patterning device MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise adjusting device for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the projection system PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of one or both of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus may be used in the following modes:

1. In step mode, the mask table MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
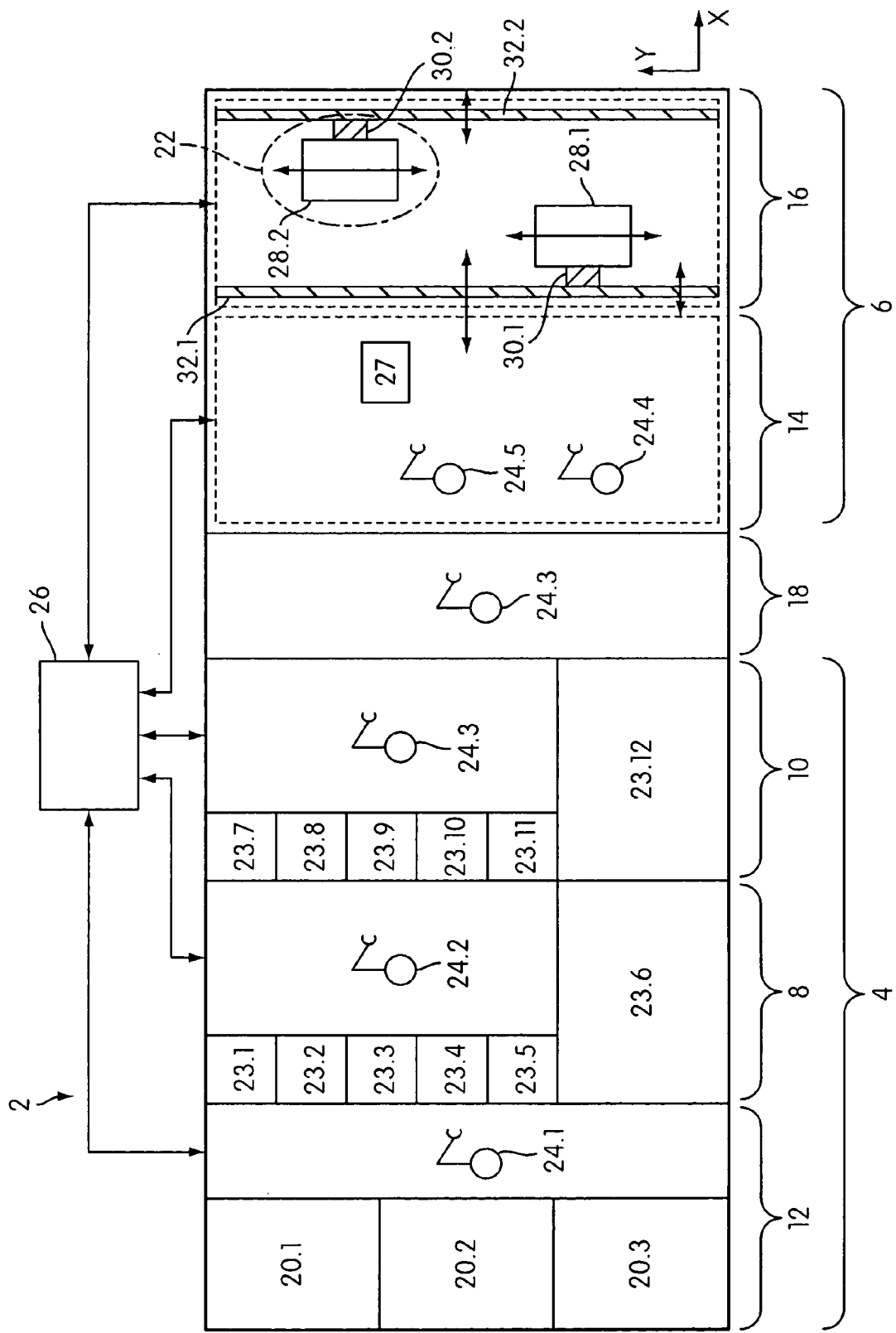
FIG. 2 is a schematic top view of a lithographic system according to an embodiment of the invention comprising a track system and a lithographic apparatus.

FIG. 2 depicts a lithographic system 2 for exposing and processing substrates of a batch of substrates. The lithographic system 2 comprises a track system 4 for processing substrates and a lithographic apparatus 6 for exposing substrates.

The track system 4 comprises a coating section 8 for coating substrates and a developing section 10 for developing substrates. Furthermore, the track system 4 is provided with a storage unit 12 for storing substrates.

The lithographic apparatus 6 comprises a substrate handler 14 and substrate stage platform 16. Note that in this example the substrate stage platform is of a dual-stage type.

Each of the substrates are built up in several layers, wherein each substrate undergoes a process of exposure and processing (baking and developing). Each substrate is conveyed several times between the track system 4 and the lithographic apparatus 6 for alternately undergoing exposure and processing processes. An interface robot 18 of the lithographic system 2 conveys the substrates between the track system 4 and the lithographic apparatus 6.

The system 2 is arranged to perform a method including:
conveying a substrate from one of the storage boxes 20.1, 20.2, 20.3 to an exposing position 22 of the lithographic apparatus 6 (generally a projection system PL is provided at this exposing position 22);
exposing the substrate at the exposing position 22 to a beam of radiation of the lithographic apparatus 6;
conveying the exposed substrate from the exposing position 22 to a processing position 23.$j$ ($j$=1, . . . , 12) in a processing section such as the developing section 10 for baking and/or developing the substrate; and
processing the substrate such as baking and/or developing the exposed substrate in the developing section 10.

Further, the developed substrate can be conveyed to the coating section 8 for applying a coating of resist after which the substrate is conveyed again to the exposing position 22 for exposing a subsequent layer of the substrate, etc.

From the overview in FIG. 2, it is clear that substrates are conveyed or transported according to an input path from the track system 4 (for example from the storage section 12, the coating section 8 or the developing section 10) towards the lithographic apparatus 6 (more specifically the exposing position 22), and via an output path from the exposing position 22 towards the track system 4, wherein (as FIG. 2 clearly shows) the input and output paths cross each other. The conveying of the substrates along the input and output paths is performed by robot arms 24.1, 24.2, 24.3, etc. Since a high throughput ratio (productivity) is important the traffic of substrates is intensive. The intensive traffic increases the chance of traffic jams. Traffic jams can occur as a consequence of the fact that an output path is blocked by substrates conveyed/transported via an input path or that a congestion builds up before a relatively slow operating position.

The substrate handler 14 comprises a robot including the robot arms 24.4 and 24.5. The robot arm 24.5 (load robot arm) is arranged for feeding substrates to the substrate stage platform 16 and the robot arm 24.4 (discharge robot arm) is arranged to receive substrates from the substrate stage platform 16. Before a substrate is fed to the platform 16, it typically undergoes a pre-alignment operation in the pre-alignment position 27. In this pre-alignment operation the substrate surface height and/or the orientation of the substrate is measured. Next, in the situation as indicated in FIG. 2, the measured substrate is then handed to the first stage 28.1 of the dual substrate stage platform 16. The first stage 28.1 for holding a substrate is connected to a first arm 30.1 which is movable in the indicated Y-direction along and connected to a second arm 32.1 which is movable in the X-direction. In the same way the dual substrate stage platform 16 comprises a second stage 28.2 for holding a substrate, the stage 28.2 is connected to a first arm 30.2 which is movable in the indicated Y-direction along and connected to a second arm 32.2 which is movable in the X-direction. Now, the first and second stages 28.1, 28.2 can be mutually exchanged (a so-called stage swap). For executing the stage swap the stages are moved towards each other, each stage is decoupled from its first arm, and each stage is coupled to the first arm of the other stage in order to exchange the stages. In this way it is possible to exchange the stage 28.2 holding an exposed substrate with the stage 28.1 holding a fresh substrate. Thereafter, the arms 30.2, 32.2 move the first stage 28.1 holding the fresh substrate for the exposure process while the second stage 28.2 holding the exposed substrate is moved by the arms 30.1, 32.1 towards an unload position where the exposed substrate is picked up by the robot arm 24.4 and conveyed towards the track system 4 via the interface robot arm 24.3.

It would be advantageous, for example, that all substrates of a batch at least have essentially the same quality and thus the same critical dimension and/or critical dimension uniformity. Accordingly, in an embodiment, it is a goal to achieve essentially the same post exposure time for all substrates of the batch, the post exposure time being measured between the end of the exposure process and the start of the processing process (e.g., a baking process). This may be achieved by a control system 26 that controls a timing such that the time interval between the end of the exposing step and the start of the processing step is essentially the same for each substrate of the batch of substrates.

The control system 26 gets data inputs from the track system and the lithographic apparatus, which input can include the status of the robot arms and positions of substrates to be conveyed, in order to check whether conditions relating to the input and the output path from the substrate stage platform are complied with.

For the condition of the output path, it is checked whether an exposed substrate of the batch of substrates can be conveyed directly after exposure, without varying time delay, from the exposure position to a processing position (for example at a developing section 10).

For the condition of the input path, it is checked whether one or more fresh substrates on the way to the substrate stage platform 16 is/are not blocking to one or more exposed substrates on the way to a processing position.

If these conditions or requirements relating to the input path and/or the output path are not met, then a pre-exposure delay to the exposure process is applied until the or these conditions are met. In an embodiment, the exposure process is only started the moment that it is clear that the time interval between the end of the exposure process and the start of the processing process will be substantially equal to a constant, and for example pre-determined, time interval.

The condition relating to the input path will now be explained in more detail. According to this condition, it is checked whether the input path is not blocking and in particular whether there will be a fresh substrate n+1 (n being an integer) in time for the stage swap on the stage which is connected to the arms 30.1, 32.1 (note that this changes after a stage swap such that either stage 28.1 or stage 28.2 can then be connected to arms 30.2, 32.2) upon the moment that the substrate n is exposed on the other stage.

An example of a possible implementation of the input path condition will now be discussed with reference to FIG. 3. At current time $T_c$, a substrate with the sequence number n [n being an integer] is ready to undergo exposure for a time duration $T_{E,n}$. This exposure only starts if the requirement for the input path is met, implicating that the next substrate (n+1) will be, at least just in time, ready for a stage swap as explained before, as soon as substrate n finished undergoing exposure. Thus according to the input path condition, substrate (n+1) must have finished undergoing:

pre-alignment at pre-alignment position 27 (during a time interval $T_{PA,n+1}$);

loading by the robot arm 24.5 onto the stage connected to arms 30.1, 32.1, wherein the loading during a time interval $T_{load}$;

detailed measuring on the stage during a time interval $T_{M,n+1}$, the detailed measuring taking place on the stage which is connected to arms 30.1, 32.1.

Figure 3:
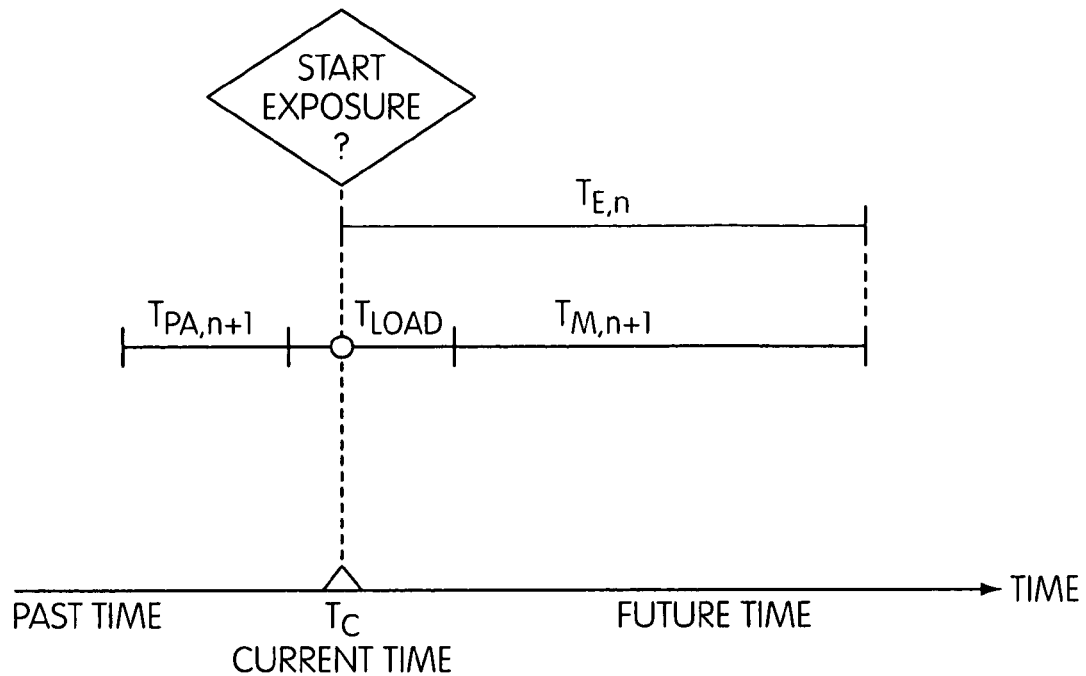
FIG. 3 is a schematic visualization of a condition to be fulfilled for exposing a substrate according to an embodiment of the invention.

In other words, if in FIG. 3, at the current time $T_c$ the next substrate (n+1) passed the input path time-check-point (which depends on the recipe and machine constants of the lithographic apparatus 6) then the input path condition is fulfilled. Generally, $T_c$ is not known beforehand, but a stopwatch-type implementation can be used to determine $T_c$ as a function of the time of the end of pre-alignment, the time of the end of loading or other available signals. The condition on the input path allows buffering substrates on the input path to absorb track substrate flow variability. The condition on the input path also provides robustness with respect to different recipes used at the lithographic apparatus 6 or the track system 4.

Figure 4:
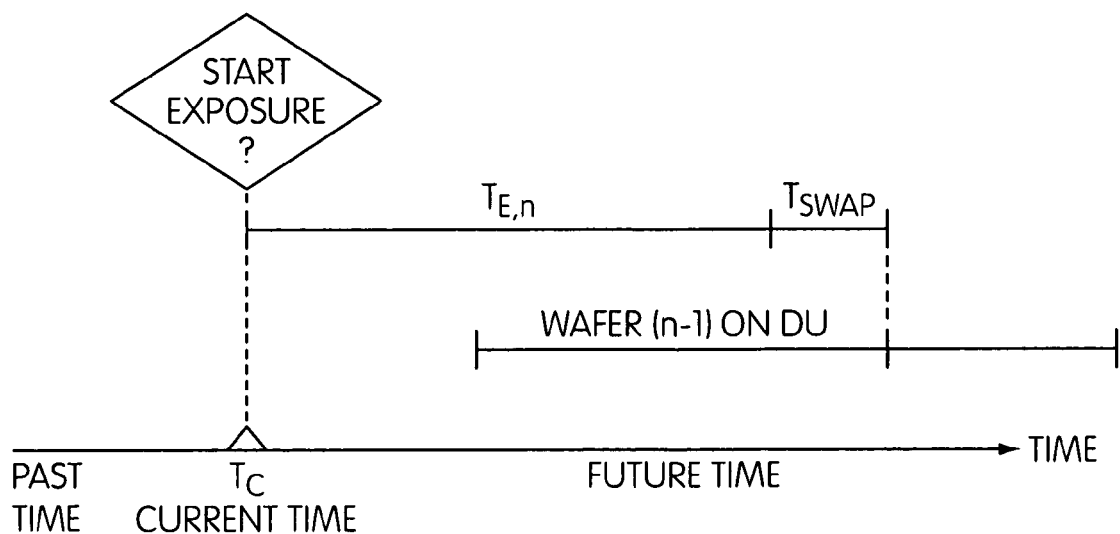
FIG. 4 is a schematic visualization of a condition to be fulfilled for exposing a substrate according to an embodiment of the invention.

The condition for the output path can check whether the output path is empty. An example of such an output path condition is now discussed with reference to FIG. 4. According to the output path condition, it is checked whether the output path will be free at the end of the exposure of substrate n, such that the substrate n can be conveyed without being hindered by unpredictable obstacles. To perform the check, information from the track system 4 may be used and a prediction made at which moment in time an exposed substrate could be unloaded. As shown in FIG. 4, the exposure of substrate n, having a time duration of $T_{E,n}$, starts at current time $T_c$ and is followed by a stage swap taking a time duration of $T_{Swap}$. In an embodiment, the discharge robot arm 24.4 is empty (such that the previous substrate (n−1) has completely been discharged by the discharge robot arm) at the time $(T_c+T_{E,n}+T_{Swap})$. This means that the exposed substrate n can directly be discharged by the discharge robot arm 24.4 after the exposure and the stage swap, after which the exposed substrate can be conveyed directly further on toward the relevant processing position. It is noted that the discharge robot arm can be used as a buffer, this would however increase the chance of a variable output flow.

In an embodiment, both the input path condition and the output path conditions are complied with before the exposure process is started. Consequently, the stage swap will be performed when both stages of the dual stage platform are loaded with a substrate, when the input path does not block the output path, and when the output path is free to directly convey the exposed substrate after exposure. A pre-exposure time delay may be inserted until it is clear that both conditions may be complied with at a predicted time point in the future indicating the end of the exposure process.

Thus, the input path condition is that a measured fresh substrate at one stage is available just before the stage swap and the output path condition is that the discharge robot arm is ready after the exposure process and the stage swap to convey the exposed substrate. By regulating post-exposure time in this manner, the quality of substrates in a batch may be essentially equal and of a relatively high quality level.

Figure 5:
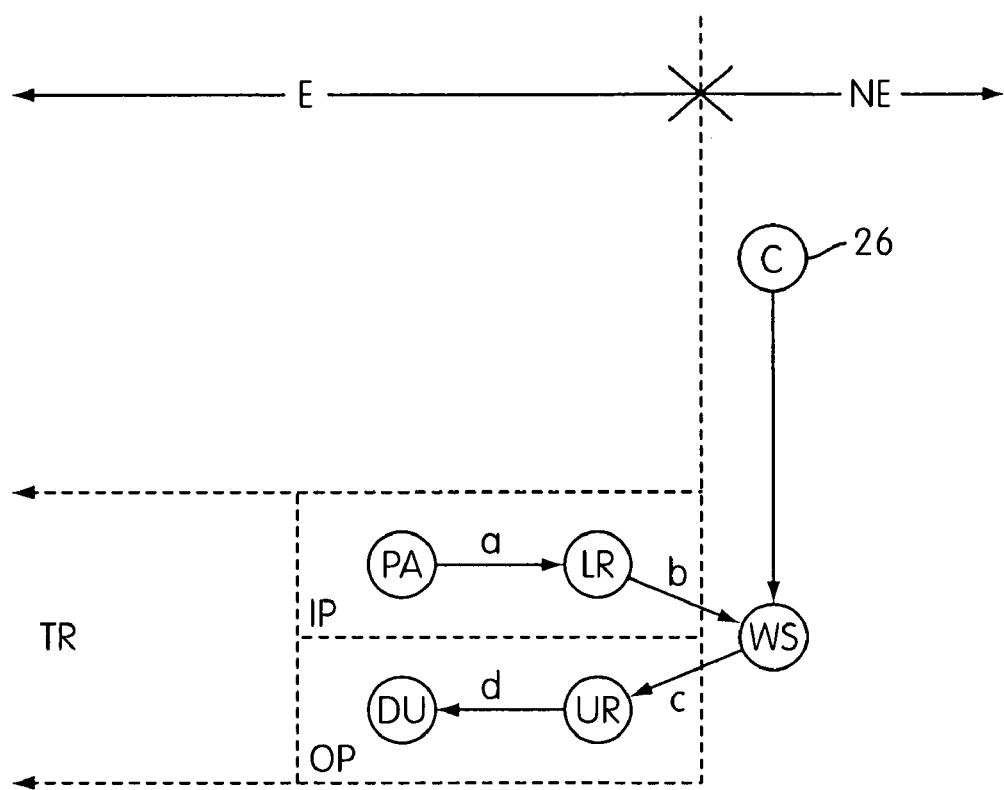
FIG. 5 is a schematic visualization of a control process using the conditions illustrated in FIGS. 3 and 4.

FIG. 5 presents a graphical representation of a possible control process for the lithographic system according to an embodiment of the invention. The graph represents a single-point substrate flow controller wherein only one point is primarily controlled through the flow of substrates. The graph is divided into two main parts: The first main part is the part on the left in FIG. 5 and is generally indicated with the symbol E. This first main part includes all sub-processes which are Eager processes. An Eager process is a process that immediately starts processing a substrate after receipt from a preceding process. The second main part is the part on the right in FIG. 5 and is generally indicated with the symbol NE. This second main part includes all sub-processes which are Non-Eager processes. A Non-Eager process is a process that waits to start a process on an already received substrate from a preceding process, after receipt of an initialization signal. In FIG. 5, control C can send such an initialization signal to a Non-Eager process such as for starting the exposure of a substrate on a substrate stage WS.

FIG. 5 indicates schematically processes which are part of the track (TR), the input path (IP) and the output path (OP). In FIG. 5, each resource (pre-alignment PA, load robot LR, unload robot UR, discharge unit DU, substrate stage WS) performs a fixed cycle: receive a substrate from a previous process, process the received substrate, and send the substrate to the next process. The processes are controlled by a control unit 26 (C).

In the overall process of FIG. 5, two consecutive processes negotiate between themselves about the substrate transfer without a supervisory control. The only interference in the flow of the substrates is to delay the Start_Exposure-_Point (controlled by C) if the input path and/or the output path conditions do not hold.

While specific embodiments of the invention have been described above, it will be appreciated that the invention may be practiced otherwise than as described. The description is not intended to limit the invention.

The invention claimed is:

1. A device manufacturing method for a substrate of a batch of substrates, wherein the method comprises:
   conveying the substrate to an exposing position of a lithographic apparatus;
   exposing the substrate at the exposing position to a beam of radiation of the lithographic apparatus; and
   conveying the exposed substrate from the exposing position toward a processing position configured to process the exposed substrate,
   wherein a start time for the exposing of the substrate is varied so as to control that a time interval between the end of the exposing of the substrate at the exposing position and the start of processing of the substrate at the processing position for the substrate is substantially the same as for each other substrate in the batch of substrates.

2. A method according to claim 1, wherein the controlling of the timing is performed on the basis of information relating to conveying the substrate to the exposing position, conveying the exposed substrate from the exposing position, or both.

3. A method according to claim 1, wherein the controlling of the timing comprises introducing a time delay before the exposing of the substrate.

4. A method according to claim 1, wherein the conveying the substrate to the exposing position comprises conveying the substrate into a buffer located just before the exposing position and conveying the substrate from the buffer toward the exposing position.

5. A method according to claim 4, wherein the conveying the exposed substrate from the exposing position comprises conveying the exposed substrate into the buffer and conveying the exposed substrate from the buffer toward the processing position.

6. A method according to claim 4, wherein the buffer is located at a first stage of a dual stage lithographic apparatus and the exposing position is located at a second stage of the dual stage lithographic apparatus, the first and second stages capable of being interchanged by a stage swap.

7. A method according to claim 1, wherein the controlling of the timing comprises initiating the exposing of the substrate if at least one of the following conditions is complied with:
   an input path condition wherein conveying a subsequent substrate to the exposing position can be completed substantially by or at the moment that exposure of a current substrate is completed; and
   an output path condition wherein conveying a current substrate from the exposing position can be performed in a pre-determined time interval starting after exposure of a current substrate is completed.

8. A method according to claim 7, wherein the exposing of the substrate is initiated if both conditions are complied with.

9. A method according to claim 1, wherein the controlling of the timing comprises initiating the exposing of the substrate if at least one of the following conditions is complied with:
   an input path condition wherein conveying a subsequent substrate to a buffer can be completed substantially by or at the moment that exposure of a current substrate is completed; and
   an output path condition wherein conveying a current substrate from the exposing position can be performed in a pre-determined time interval starting after exposure of a current substrate is completed.

10. A method according to claim 9, wherein the exposing of the substrate is initiated if both conditions are complied with.

11. A computer program configured to control a machine, the machine being at least a subsystem of a lithographic system, the computer program comprising program code that, when executed on a computer system, instructs the computer system to perform a method comprising:
    conveying a substrate of a batch of substrates to an exposing position of a lithographic apparatus;
    exposing the substrate at the exposing position to a beam of radiation of the lithographic apparatus; and
    conveying the exposed substrate from the exposing position toward a processing position configured to process the exposed substrate,
    wherein a start time for the exposing of the substrate is varied so as to control that a time interval between the end of the exposing of the substrate at the exposing position and the start of processing of the substrate at the processing position for the substrate is substantially the same as for each other substrate in the batch of substrates.

12. A computer program according to claim 11, wherein the controlling of the timing is performed on the basis of information relating to conveying the substrate to the exposing position, conveying the exposed substrate from the exposing position, or both.

13. A computer program according to claim 11, wherein the controlling of the timing comprises introducing a time delay before the exposing of the substrate.

14. A computer program according to claim 11, wherein the conveying the substrate to the exposing position comprises conveying the substrate into a buffer located just before the exposing position and conveying the substrate from the buffer toward the exposing position.

15. A computer program according to claim 14, wherein the conveying the exposed substrate from the exposing position comprises conveying the exposed substrate into the buffer and conveying the exposed substrate from the buffer toward the processing position.

16. A computer program according to claim 14, wherein the buffer is located at a first stage of a dual stage lithographic apparatus and the exposing position is located at a second stage of the dual stage lithographic apparatus, the first and second stages capable of being interchanged by a stage swap.

17. A computer program according to claim 11, wherein the controlling of the timing comprises initiating the exposing of the substrate if at least one of the following conditions is complied with:
    an input path condition wherein conveying a subsequent substrate to the exposing position can be completed substantially by or at the moment that exposure of a current substrate is completed; and
    an output path condition wherein conveying a current substrate from the exposing position can be performed in a pre-determined time interval starting after exposure of a current substrate is completed.

18. A computer program according to claim 17, wherein the exposing of the substrate is initiated if both conditions are complied with.

19. A computer program according to claim 11, wherein the controlling of the timing comprises initiating the exposing of the substrate if at least one of the following conditions is complied with:
    an input path condition wherein conveying a subsequent substrate to a buffer can be completed substantially by or at the moment that exposure of a current substrate is completed; and
    an output path condition wherein conveying a current substrate from the exposing position can be performed in a pre-determined time interval starting after exposure of a current substrate is completed.

20. A computer program according to claim 19, wherein the exposing of the substrate is initiated if both conditions are complied with.

* * * * *